US006181615B1

(12) United States Patent
Chhor

(10) Patent No.: US 6,181,615 B1
(45) Date of Patent: *Jan. 30, 2001

(54) CIRCUITRY, APPARATUS AND METHOD FOR EMBEDDING QUANTIFIABLE TEST RESULTS WITHIN A CIRCUIT BEING TESTED

(75) Inventor: Khushrav S. Chhor, Fremont, CA (US)

(73) Assignee: Cypress Semiconductor Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/050,243

(22) Filed: Mar. 30, 1998

(51) Int. Cl.[7] ....................................................... G11C 7/00
(52) U.S. Cl. ............................................. 365/201; 371/21.1
(58) Field of Search ........................... 365/201; 371/21.1, 371/21.2, 21.6, 27.6

(56) References Cited

U.S. PATENT DOCUMENTS

| 4,510,673 | 4/1985 | Shils et al. ............................... 29/574 |
| 4,931,997 | 6/1990 | Mitsuishi et al. ...................... 365/218 |
| 5,084,843 | 1/1992 | Mitsuishi et al. ...................... 365/218 |
| 5,256,578 | 10/1993 | Corley et al. . |
| 5,406,566 | 4/1995 | Obara . |
| 5,457,408 | 10/1995 | Leung . |
| 5,627,838 | 5/1997 | Lin et al. ......................... 365/185.29 |
| 5,642,307 | 6/1997 | Jernigan ................................ 365/103 |
| 5,664,093 | 9/1997 | Barnett et al. ................... 395/183.07 |
| 5,725,559 | 3/1998 | Alt et al. ............................... 128/903 |
| 5,818,848 | 10/1998 | Lin et al. ............................. 371/21.1 |
| 5,864,714 | 2/1999 | Todd et al. ............................ 395/712 |
| 5,867,714 | 2/1999 | Todd et al. ............................ 395/712 |
| 5,892,683 | 4/1999 | Sung ..................................... 364/488 |
| 5,905,887 | 5/1999 | Wu et al. .............................. 395/555 |
| 5,907,671 | 5/1999 | Chen et al. ...................... 395/182.04 |
| 5,917,833 | * 6/1999 | Sato ...................................... 365/201 |
| 6,018,686 | 1/2000 | Orso et al. ........................... 700/117 |

* cited by examiner

Primary Examiner—Son T. Dinh
(74) Attorney, Agent, or Firm—Kevin L. Daffer; Conley, Rose & Tayon

(57) ABSTRACT

An integrated circuit, a programming mechanism and a method is provided for programming test information upon non-volatile storage devices of the integrated circuit. The test information includes a pass/fail outcome arising from one or more test operations to which the integrated circuit is exposed. In addition to or in lieu of the test outcomes, test results of one or more parametric tests at select test operations can be measured from and programmed back into the integrated circuit. Test limits against which the test results can be compared may also be programmed into the integrated circuit. The test outcomes of various test operations, test results of various test parameters and test limits of the same or dissimilar test parameters are stored in separate non-volatile storage locations attributed to the integrated circuit. Those storage locations and, particularly, the bits contained therein are read either before the integrated circuit is packaged, after it is packaged, or after the packaged integrated circuit is shipped to customer. Programming test information as to that particular integrated circuit provides traceability of test operations performed, quality control of integrated circuits shipped, failure analysis of integrated circuits manufactured and, in some instances, lessened overall test time.

21 Claims, 5 Drawing Sheets

| PROG BITS | DATA QUANTITY | PROG BITS | DATA QUANTITY |
|---|---|---|---|
| ...0000 | X | ...0000 | X |
| 0001 | X+Y | 0001 | X+Y |
| 0010 | X+2Y | 0010 | X+2Y |
| 0011 | X+3Y | 0100 | X+3Y |
| 0100 | X+4Y | 1000 | X+4Y |

CIRCUITRY, APPARATUS AND METHOD FOR EMBEDDING QUANTIFIABLE TEST RESULTS WITHIN A CIRCUIT BEING TESTED

RELATED APPLICATION

This application is related to a co-pending U.S. patent application to Chhor and Orso entitled "Circuitry, Apparatus and Method for Embedding a Test Status Outcome Within a Circuit Being Tested" which is incorporated as if fully set forth herein.

BACKGROUND OF THE INVENTION

1. Field of the Invention

This invention relates to integrated circuit manufacture and, more particularly, to a circuit, apparatus and method for electrically programming parametric and/or function test results upon and retrieving those test results from a circuit being tested.

2. Description of the Related Art

An integrated circuit is often referred to as a die or chip. Henceforth, those terms are interchangeably used. A die generally contains several thousand active and passive devices formed on a monolithic substrate. Those devices are generally interconnected to form an overall circuit.

The monolithic substrate is derived from what is called a semiconductor wafer which may embody several hundred die across that wafer. After the active and passive devices are formed and selectively interconnected, each die is then tested both visually and electrically. The die which fail testing may then be marked with a visually detectable imprint or marking. Die which are not marked can then be separated from the wafer and forwarded to an assembly operation.

Assembly involves placing electrically and visually viable die into a semiconductor package. Conventional assembly operations draw die from anywhere across a wafer, or from any wafer within a set of wafers or wafer lot. After assembly, the packaged die are tested. Leads extending from the package are electrically connected to a test socket which supplies stimuli to the die and receives an electrical result. The test performed after assembly may be similar to or slightly different from those performed before assembly.

FIG. 1 illustrates an exemplary, conventional sequence of tests 10 performed prior to and after assembly 12. The first test operation 14 performed on die within a wafer includes various parametric and functional tests. For example, the test parameters may include determining the current draw of the integrated circuit through the power supply conductor (i.e., $I_{CC}$). Additionally, test 14 may determine "high" and "low" output levels of various output pins for specific input stimuli (i.e., $V_{OH}$ and $V_{OL}$). Yet further, test 14 may include test parameters used to check propagation delay (i.e., $T_{PD}$) and/or operating speed of the integrated circuit. If the integrated circuit embodies non-volatile storage elements, then a test of those elements may be needed. In particular, the elements may lose their program state or a non-programmed element may gain program status. Charge loss or gain may occur when the unpackaged die or packaged die is stressed either through electrical interactions or when a heat cycle is applied thereto.

Test operation 14 may therefore encompass numerous tests which may be similar to, partially similar to, or possibly altogether different from tests within subsequent test operations. In many instances test 14, being the first test operation, should encompass more tests parameters than subsequent tests and/or encompass tighter tests limits than subsequent tests. Accordingly, each of the sequence of tests 10 produce a quantifiable test result for each parameter being tested. Also, each of the sequence of tests 10 include and tests limits for each test parameter. For example, $V_{OH}$ and $V_{OL}$ are represented as a quantifiable voltage value. The quantifiable test result for each test parameter is typically compared against a test limit. If the test results surpasses the test limit, then the die or packaged die will be placed in a "bin" as a failure 16. Thus, the test sequence 10 will check to see if the die being tested is within the test limit or range (i.e., passes) each of the tested parameters. If a pass 18 occurs, then the die may undergo temperature stress before being tested again or, in the alternative, be tested at a different temperature subsequent to the first test 14. Temperature cycling the die before or during the second test 20 helps determine reliability of the die. Test 20 is similar to test 14 in that it represents an electrical test comprising a plurality of electrical test parameters. Second test 20 may contain parameters which are partially the same as, entirely the same as, or altogether different from the parameters used for test 14. If the test results of each test parameter are within the corresponding test limits, then the die is said to pass 22 the second test 20.

There may be numerous tests performed at wafer sort, often called wafer probe. In the example shown, two tests are performed possibly at different temperatures and possibly with interim temperature cycling. The die which pass both tests may then be assembled as good, packaged die. The assembly operation itself may harm or destroy the packaged die. Thus, tests must be performed after assembly and before shipping the final product to a customer. Shown in FIG. 1 is an exemplary pair of test operations 24 and 26 performed after assembly. If the first test 24 passes 28, then the second test 26 is undertaken. The parameters used in test 24 may be the same as or dissimilar to the parameters used in test 26. Likewise, the tests limits may be different. In many instances, the parameters may be the same, but the limits are preferably loosened for subsequent tests relative to earlier tests. In this way, failures can be screened earlier in the test sequence. Test 26 can suffice as possibly the final tests performed at limits defined by the specification published by the integrated circuit manufacturer. The results of each parameter being tested at test 26 are compared against the specification limits to determine if the packaged integrated circuit passes 30. If the packaged die does pass, then the packaged product is shipped 32 to a customer.

An unfortunate outcome of a conventional test sequence is a lack of quality control. For example, a test result may be stored within a database which tracks the products being tested. The database is, however, maintained remote from the integrated circuit. If the integrated circuit fails in the field, then the only way in which to determine if the product was shipped as a failure is to examine the database. This assumes that the database is maintained by the manufacturer and traceability between the identified integrated circuit and the test result is not corrupted. As shown in FIG. 1, test outcome 34 is stored within a database and is generally attributed to a wafer lot or wafer run, and not necessarily to each and every packaged integrated circuit tested and/or shipped.

Absent traceability to a particular integrated circuit shipped, the manufacturer cannot easily control the quality of the shipped product either after it is shipped or, more importantly, before it is shipped. Thus, an integrated circuit which fails in the field may not have attributed to it data stored within a database. Even if there is data attributed, attribution occurs only after the packaged product is shipped. The database therefore suffers as a failure analysis tool prior to shipping the product. A comparison of test results from one test to another may be difficult since the database information is not always recalled at each test operation. Determination of how, when, and the magnitude of each failure at specific test operations is difficult unless data within the database can be quickly and easily recalled at each and every, subsequent test operation. Currently, mechanisms to easily program the database and recall information unique to each and every test operation, and possibly each and every test parameter used at those operations, is lacking.

SUMMARY OF THE INVENTION

The problems outlined above are in large part solved by utilizing programmable features on an integrated circuit to store test parameter results, test parameter limits and test operation outcomes at which the integrated circuit is subjected. Those results, limits and outcomes are stored in non-volatile storage locations, or locations rendered non-volatile. That is, the integrated circuit is one which preferably includes non-volatile storage elements such as, for example, programmable read only memory (PROM), fuses, and/or anti-fuses, etc. Examples of popular PROMs include EPROMs, EEPROMs, or flash EPROMs. The fuses or anti-fuses can be electrically programmed or programmed through mechanical or optical means, for example. The integrated circuit may have other non-volatile storage locations beyond those which receive bit information representative of the test results, limits or outcomes.

According to one embodiment, the outcomes of each test within a sequence of tests used by the integrated circuit manufacturer are programmed into the storage locations. Those outcomes are represented either as a pass or failure of the integrated circuit when subjected to that test operation. For example, the first wafer sort test operation will produce an outcome depending on whether the test results for each and every test parameter is within the test limits. If so, then the test equipment will program a bit indicating the integrated circuit has passed that test operation. The test outcome bit will then be stored substantially indefinitely at a unique storage location upon the integrated circuit. If that integrated circuit then goes on and passes the second wafer sort test, another bit will be programmed in another storage location upon the integrated circuit.

As a sequence of test represented as a test operation (or "insert") is accomplished and the integrated circuit passes that test operation, a corresponding bit will be programmed at a respective location on the integrated circuit. Examining the test outcome bit for a previous test operation during a current test proves beneficial for several reasons. First, the current test can be terminated if the previous test or operation outcome bit is not programmed. This greatly improves test throughput. Secondly, examining the previous test outcome bit assists in determining possible reasons why the integrated circuit fails the current test operation. Yet further, the test outcome bits for each test operation can be examined not only in subsequent test operations but also after the product is shipped to the customer. The test outcome bits can then be examined in the field to determine which, if any, test operation the integrated circuit failed. Having this information would not only help in failure analysis but also would enhance the quality control measures taken by the manufacturer.

According to another embodiment, quantifiable measures of test results and the limits by which those results are compared are programmed are kept track of for each test parameter within each test operation. Specifically, the measured test results of various parametric tests at select test operations can be quantified and stored within the integrated circuit as test result bits. Thus, select test results of possibly a subset of test parameters are encoded into digital format and stored upon the integrated circuit. The storage locations which receive the test result bits are separate from those locations which receive the test outcome bits, if both types of indicia are embodied upon the integrated circuit. Of benefit is the measurement of only a unique set of test results within one test operation possibly dissimilar from the measurement of other test results within another test operation. Thus, the test results being monitored will possibly differ among the test operations used by the manufacturer, depending on which test parameter need be monitored at certain test operations.

Not only is it important to monitor the test result bits programmed into the integrated circuit, but also there may be benefit gained in monitoring the limit at which the test result is compared. The test limit, similar to the test result, can be converted into a digital format corresponding to that limit. The resulting test limit bits can be unique to each test parameter in each test operation within the sequence of test operations.

Knowing results at various test operations and for specific test parameters within those operations proves helpful in determining how and when failure occurred, and the possible reasons why latent failures arise. Having information stored into the integrated circuit at each test operation may therefore allow the engineer to determine possible skews in test results caused, for example, by temperature cycling the integrated circuit in the interim between test operations. Knowing the test results and the test limits by which those results are compared therefore appears beneficial not only as a quality control measure after the product is shipped but also primarily as a failure analysis tool prior to shipment.

Broadly speaking, the present invention concerns an integrated circuit which programmably receives information as to the outcome of electrical tests performed on the integrated circuit. Further, the invention concerns an apparatus for programming the integrated circuit and reading the programmed status. Yet further, the present invention concerns a method for testing an integrated circuit. Testing implies not only the steps used to program test outcome, result and limit bits, but also steps for reading those bits and discerning the importance of those bits.

The present integrated circuit can be programmed to permanently retain the outcome, result and limit bits. Those bits can be programmed and read either before or after the integrated circuit is packaged. Presence of a test outcome bit for a previous test operation serves as a prerequisite for continuing the current test operation. Also, knowing the test result bits of the same parametric test performed at different test operations will indicate possible skews in the circuit operation which could pose reliability problems in the field.

The apparatus which includes the programming mechanism is one which can program a bit in a unique storage location indicative of the integrated circuit passing a test operation having numerous test parameters or parametric tests. Therefore, the test outcome bit is programmed if the integrated circuit passes all the functional and parametric tests of a particular operation. When programming the test result bits or the test limit bits, conversion is preferred from an analog format to a sequence of digital bits representative of the analog value. The number of digital bits can vary depending on the amount of resolution needed.

Regardless of whether outcome bits or result/limit bits are programmed, those bits reside in an address range outside of an address space used to operate the integrated circuit. Accordingly, those bits will not be called upon during normal operation of the integrated circuit. Preferably, only the manufacturer will have access to those bits and will know the relevance of those bits. Once the integrated circuit is placed in the field, the normal operation of that circuit will not affect the non-volatile status of those programmed bits which can be later called upon in the field to determine possible causes of failure.

BRIEF DESCRIPTION OF THE DRAWINGS

Other objects and advantages of the invention will become apparent upon reading the following detailed description and upon reference to the accompanying drawings in which.

Figure 1:
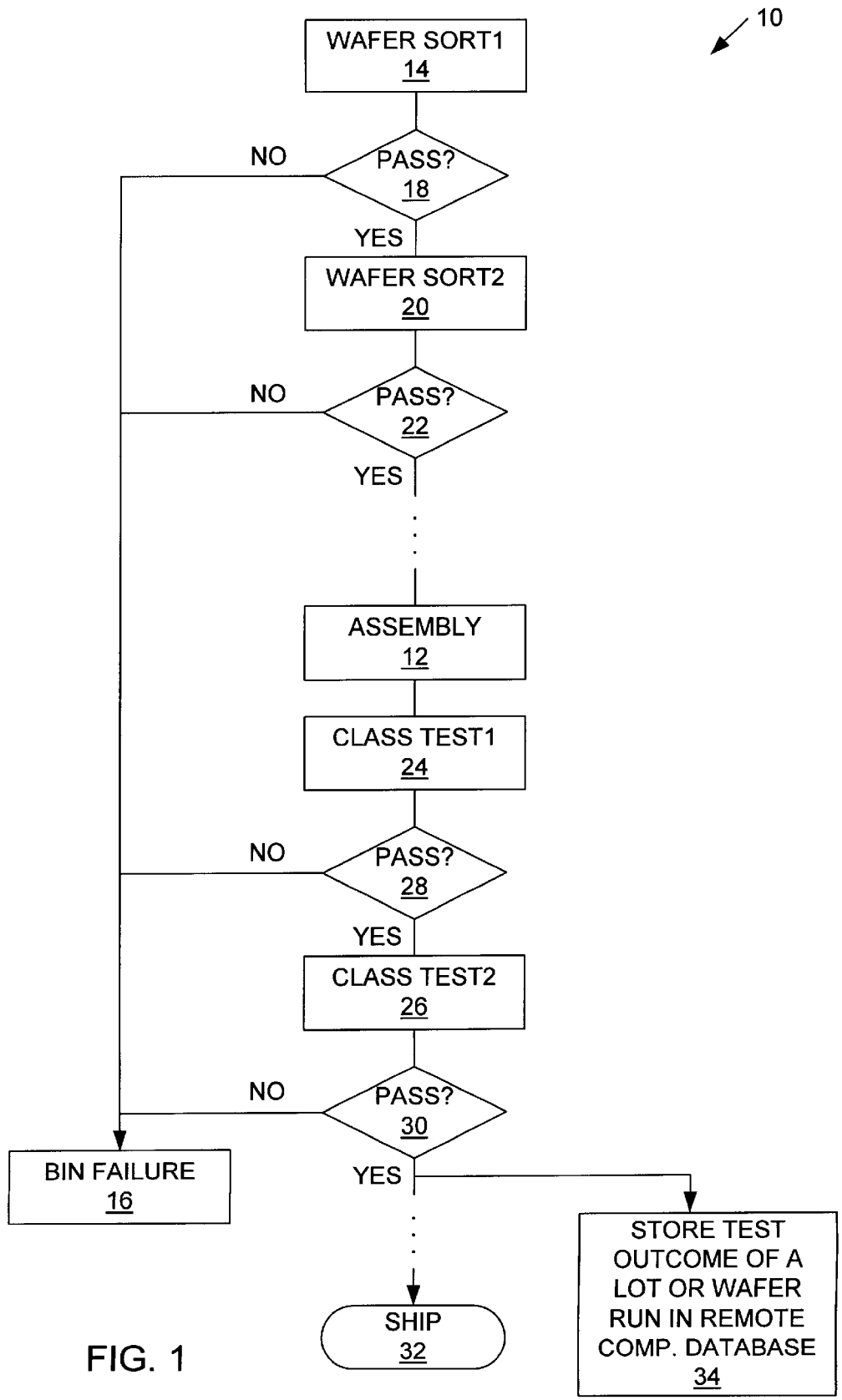
FIG. 1 is a flow diagram of a procedure used to store outcome of tests used upon an integrated circuit, wherein the test results are conventionally stored in a database located remote from the integrated circuit.

While the invention may be modified and have alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 2:
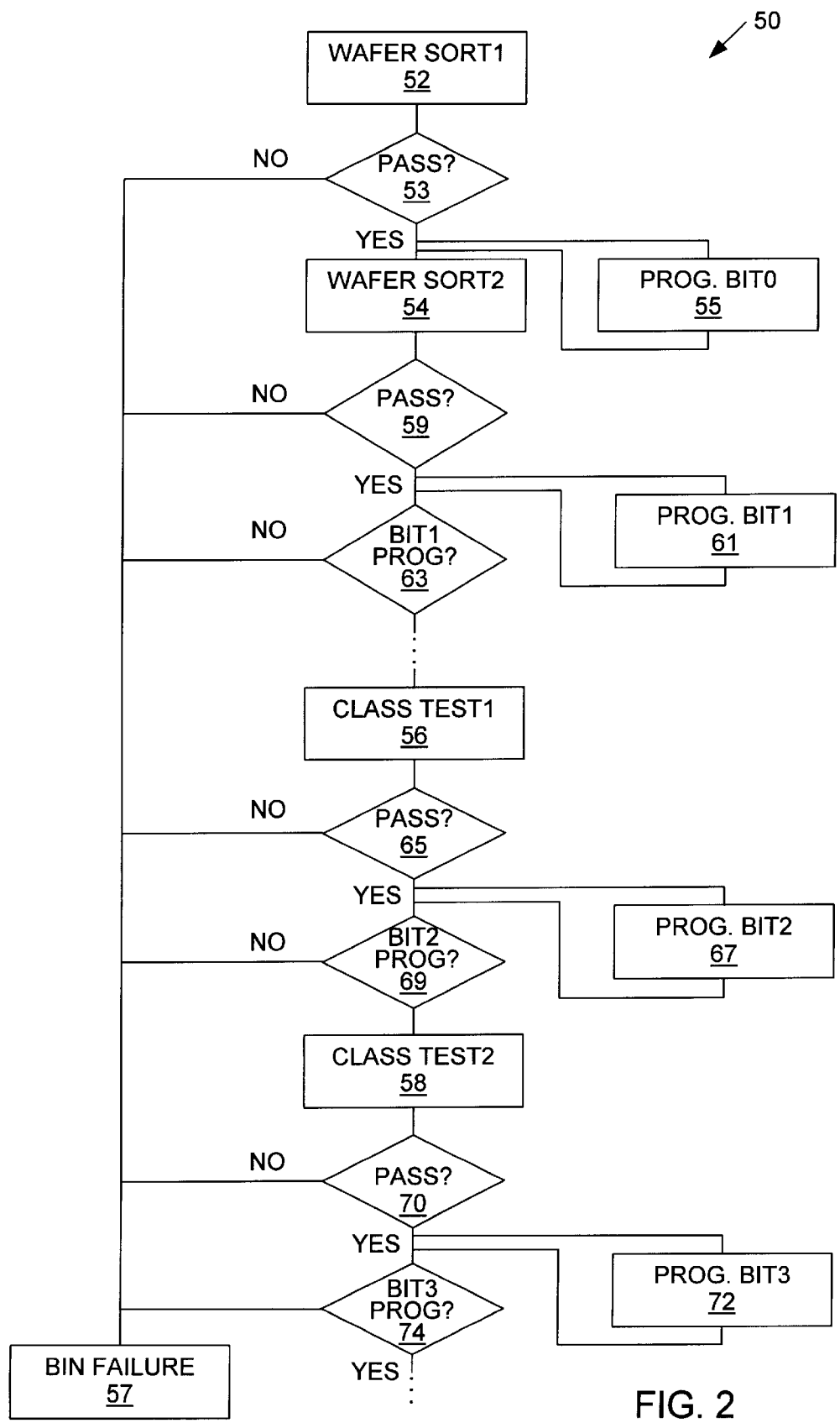
FIG. 2 is a flow diagram of a procedure used to program storage locations dedicated to receiving bits which indicate test outcomes during various test operations used by a manufacturer or user of an integrated circuit embodying the storage locations.

Turning to FIG. 2, a flow diagram 50 is shown indicating several electrical test operations 52, 54, 56 and 58 performed by a manufacturer of an integrated circuit, a latter test operation being possibly performed by a user of the integrated circuit. The first test operation 52 may be performed on a die, while the die still remains associated with a wafer.

Accordingly, test 52 is often referred to as a wafer sort test. If the die passes 53 all the test parameters of test 52, then a first bit (e.g., bit 0) is programmed 55. If the test results of at least one test parameter surpasses a corresponding test limit, then the respective storage location will not be programmed with bit 0. Instead, the die will be marked as a failure.

The die which pass first test operation 52 can be tested again at second test operation 54. Alternatively, each and every die can be tested again. Preferably, however, only the die which pass the first test are tested during second test operation 54. This is accomplished by reading a storage location containing a programmed bit 0. If bit 0 was not present at that location, then second test location operation 54 is not begun, or continued, on that corresponding integrated circuit. Accordingly, each integrated circuit has a storage location adapted to receive a programmed bit 0 corresponding to the test outcome from first test 52.

Second test operation 54 can be performed after the wafer is subjected to a temperature cycle. Alternatively, second test 54 can be performed the same time at which the wafer is heated or cooled above or below room temperature. The die which pass 59 second test operation 54 are programmed in a storage location separate from the location containing outcome from first test 52. The second storage location is programmed with a corresponding bit 61 (e.g., bit 1) to indicate that die has passed the second test operation. Thus, an integrated circuit which has passed first and second test operations has the first and second storage operations programmed with a corresponding bit 0 and bit 1.

Before the next test operation and the sequence of test is begun or continued, status of the previous test operation outcome is read. As shown, the status of bit 1 (second test operation outcome) is read to determine if the bit 1 is programmed before beginning or continuing the third test operation 56. Monitoring the previous test outcome status bit allows the test device to forego the current test operation on that particular integrated circuit. This saves a substantial amount of time and effort testing already bad integrated circuits. Also, monitoring the previous test operation outcome will guard against bin mixing—a common problem in production testing.

As shown in FIG. 2, bit 1 program status of the second test 54 is monitored 63 before beginning the third test 56. If bit 1 is programmed, then the third test 56 is allowed to proceed. If the third test passes 65 each and every parametric test, then another test location is programmed 67 with, e.g., a bit 2.

The status of the previous test outcome, e.g., bit 2 is checked 69 before beginning the next test operation 58. If test operation 58 outcome indicates all the parametric tests are within the defined limits and therefore passes 70, then another storage location is programmed 72 with e.g., bit 3.

The sequence of checking the immediately preceding test operation outcome bit status before beginning the current test operation is continued as shown by block 74. Thus, flow diagram 56 illustrates dedicated storage locations which indefinitely retain bits programmed therein based on that integrated circuit passing a corresponding test operation. If at any time the integrated circuit fails a test parameter within the current test operation or if the programmed status of the previous test outcome indicates a bit has not been programmed, then the die or packaged integrated circuit is sorted as a failure and forwarded to a bin indicating such.

FIG. 2 indicated traceability of test outcomes for at least some test operations and preferably each and every test operation performed on that integrated circuit. Traceability is embodied within the integrated circuit and therefore not separate from the integrated circuit. This greatly improves quality control prior to releasing the integrated circuit into the field. Monitoring the previous test outcome bit prior to beginning the current test operation also substantially reduces the overall test time. In many instances, there may be more than four test operations performed on an integrated circuit, each having multiple test parameters associated with that test operation. The amount of time needed to perform each test operation can therefore be substantial.

Figure 3:
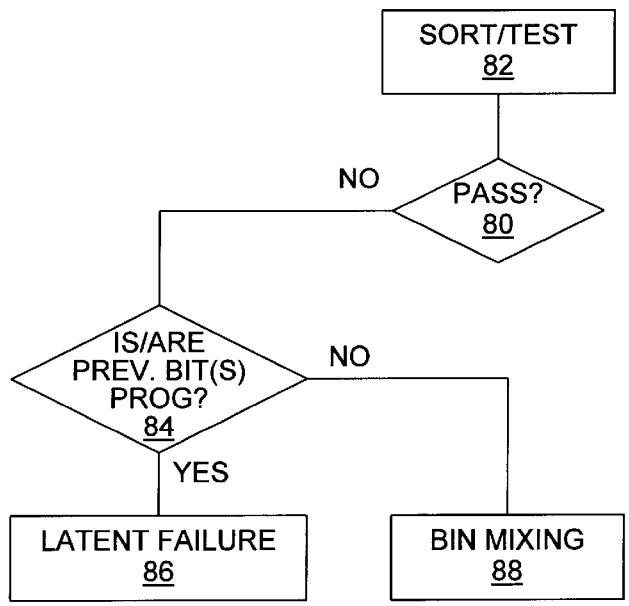
FIG. 3 is a flow diagram used to ascertain possible reasons why a test operation failure occurs.

FIG. 3 indicates yet another advantage useful in performing failure analysis. Specifically, determination on possible reasons why the integrated circuit fails a test operation is beneficial. As shown, if the integrated circuit does not pass 80 the current die sort (or packaged integrated circuit) test 82, then determination must be made as to why it did not pass. This can be accomplished by examining the previous test outcome bit or bits 84. If the previous bit is programmed to indicate the integrated circuit passed the previous test operation, then it can be determined that the integrated circuit performance has changed since its previous test. That change or skewing may be caused by stresses placed on the integrated circuit in the interim between the previous test operation and the current test operation. Those stresses often appear as latent failures 86.

Unfortunately, however, the pick-and-place handler mechanisms of production testers sometimes fail or are mis-programmed to cause previous test failures to be placed in a "good" bin category. Also, due to human error, operators may mix good and bad bins. If the current test outcome indicates a failure and the previous test outcome bit is not programmed, then it can be readily ascertained that bin mixing 88 has occurred. The benefit in monitoring the previous test outcome bit therefore serves as an efficient failure analysis tool and provides a constant monitor against the bin mixing problem.

Figure 4:
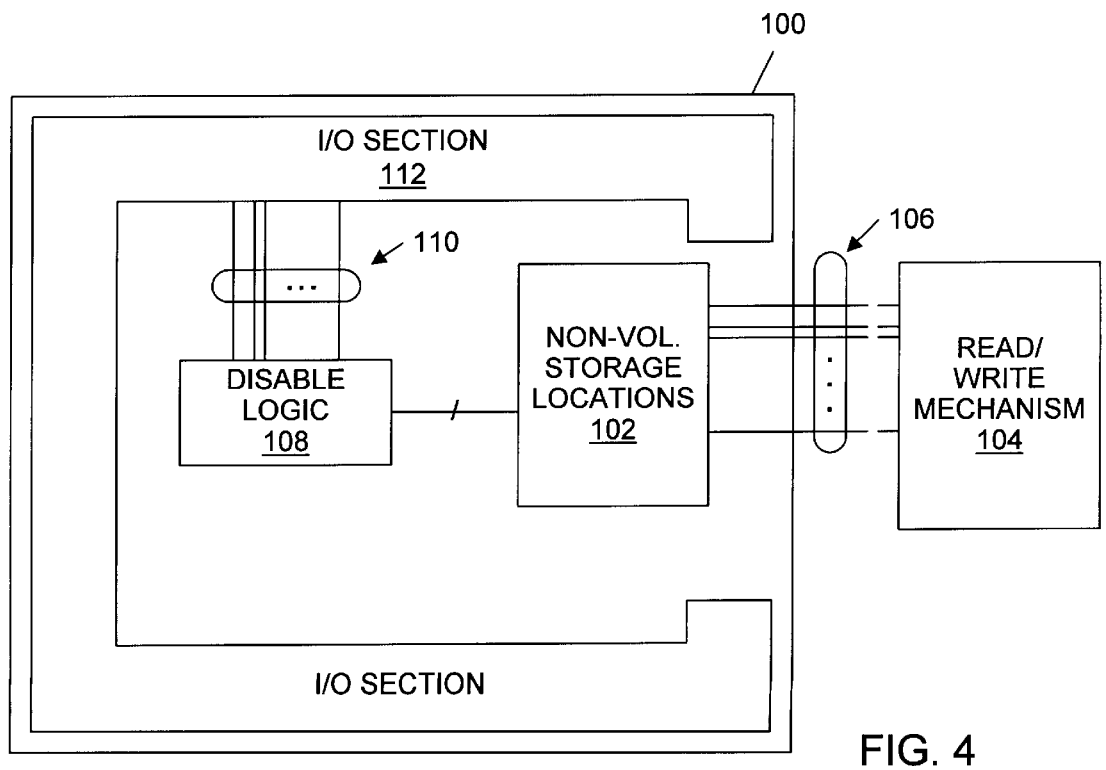
FIG. 4 is a plan diagram of an integrated circuit embodying programmable storage locations and disable logic, wherein the disable logic may respond to certain bits programmed within the storage locations by disabling operation of the integrated circuit.

FIG. 4 is a plan view of an integrated circuit 100 embodying non-volatile storage locations 102. Storage locations 102 can be written to and read from by a read/write mechanism 104. Mechanism 104 includes any circuit which generates programmed signals and receives programmed signals. Mechanism 104 may include multiple conductors extending therefrom. Each conductor is adapted to couple onto an input/output conductor (or pad) emanating from integrated circuit 100. As shown, the conductors can comprise possibly a bus 106. Each conductor can be used to transmit a signal into a particular storage location or, alternatively, can be used to receive a signal which encodes an address. The signals of each conductor are combined to form an address to select a unique storage location of a plurality of storage locations within block 102.

Disable logic 108 is coupled to the storage locations 102. Logic 108 includes combinatorial and/or sequential logic which responds to voltages stored within locations 102. Depending on which storage location is programmed, and the specific logic formed, conductors 110 forwards disable signals from logic 108 to the input/output section 112. Accordingly, disable logic 108 is configured in any fashion necessary to disable input/output buffers based on certain storage locations programmed with test operation outcomes. For example, if all of the test operation outcomes are not programmed, then disable logic 108 may induce disable signals on at least one output buffer within section 112. In this fashion, the disable logic will disable the integrated circuit from operating and producing output signals if the test outcome bits are not programmed. This will prevent bad integrated circuits from being used in the field.

Figure 5:
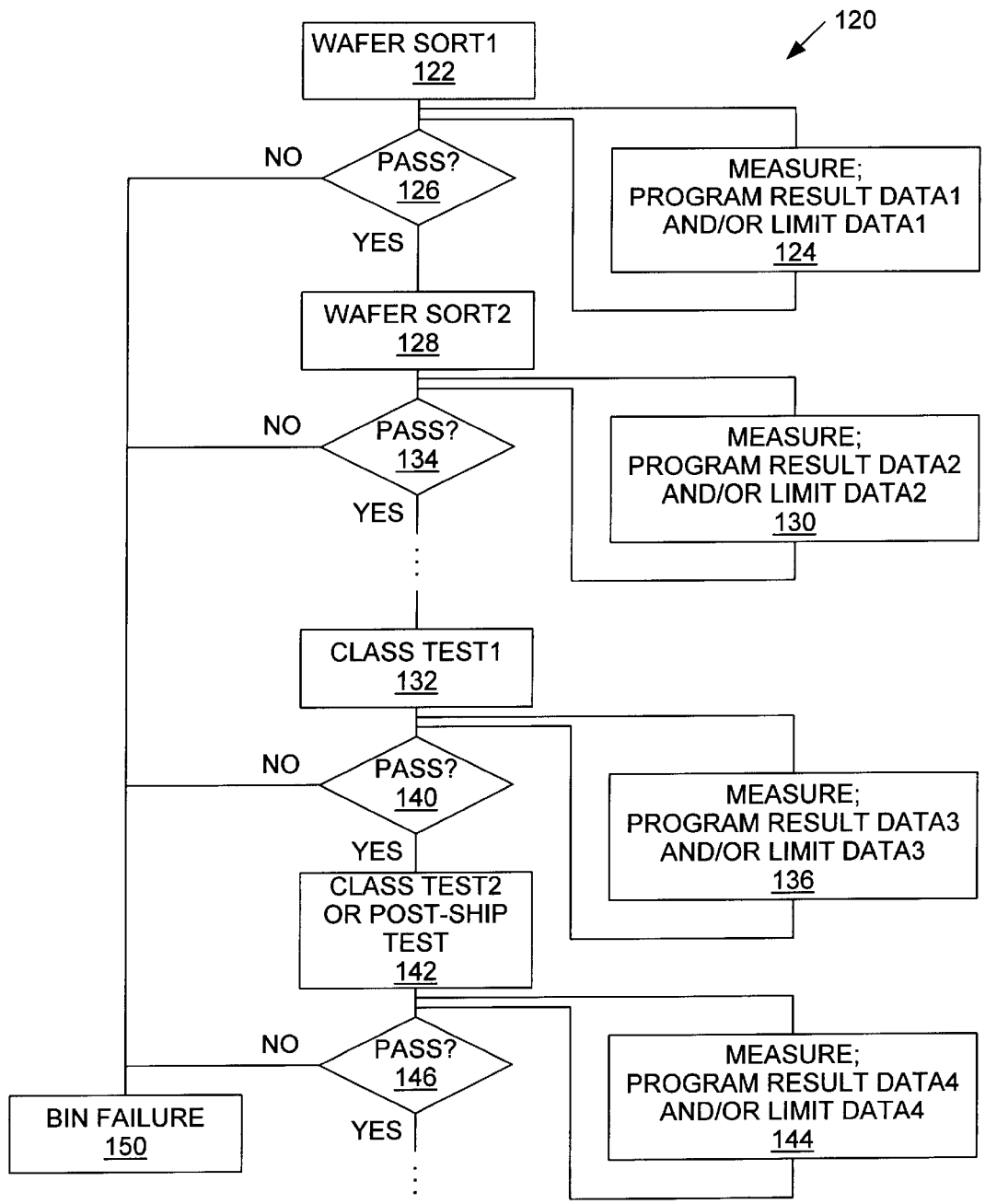
FIG. 5 is a flow diagram of a procedure used to measure quantifiable test results and program those results as well as possibly quantifiable limits against which the test results are compared to determine failures at various test operations used by the manufacturer or user of the integrated circuit.

FIG. 5 illustrates and alternative flow diagram 120 to the flow diagram 50 shown in FIG. 2. In addition to, or in lieu of simply monitoring the test outcome bits, the actual measured results and the test limits by which those results (or altogether different results) are compared can be programmed into the integrated circuit itself, as shown by flow 120.

The test result and the test limits of a first test operation 122 are measured and thereafter programmed 124 into non-volatile storage locations of the integrated circuit being tested. The test result data and/or limit data are programmed into storage locations separate from the test outcome bit storage locations (if present). If the integrated circuit passes 126 the first test 122, then a second test operation 128 can be performed. Again, the results and limit data of the second test operation are measured and programmed into the integrated circuit 130. The next test operation 132 is begun only after the previous test operation 128 indicates the integrated circuit has passed 134 that test operation. The process is repeated as shown by blocks 136–146. It is noted that the integrated circuit will be passed to a failed bin 150 if the integrated circuit fails any of the test operations.

Flow diagram 120 illustrates at least four tests, two occurring prior to assembly and two after assembly. It is noted, however, similar to FIG. 2, that fewer or more than four tests can be performed, depending on the amount of testing required. This is, of course, dependent on the number of tests needed at temperatures other than room temperature and/or the number of times in which the integrated circuit must be stressed in the interim between tests. It is noted that the last test 142 is preferably a final test (or quality control test) immediately previous to forwarding the packaged product to a customer. Alternatively, test 142 can be performed in the field by a user of the integrated circuit if so desired. If test 142 is performed in the field, then like the other tests preceding it, test results of test 142 can be measured and the test result data and/or limit data can be programmed.

Figures 6, 7, 8:
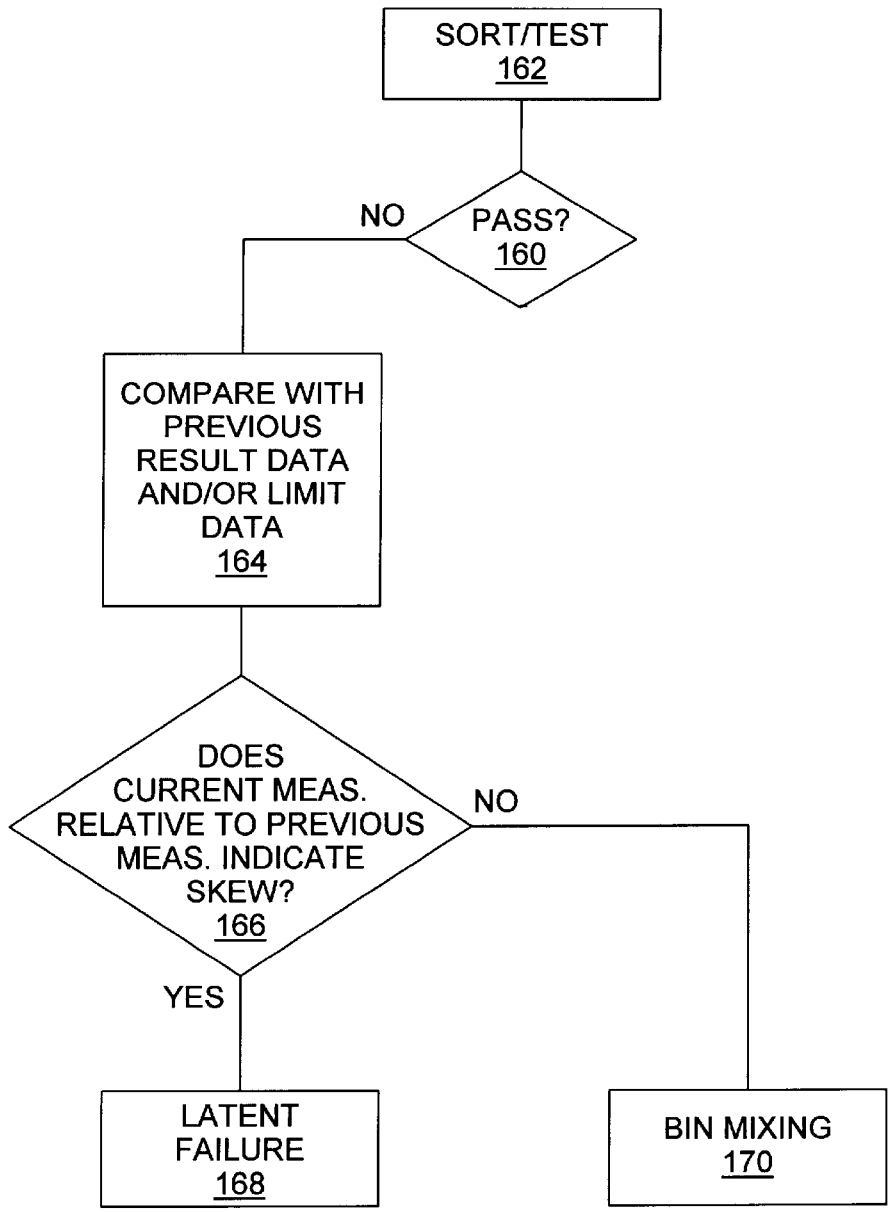
FIG. 6 is a flow diagram used to ascertain possible reasons why a test operation failure occurs, based on whether test results have skewed from one test operation to the next.
FIG. 7 is a table of one possible way in which bits can be programmed into the storage locations to indicate quantifiable test results.
FIG. 8 is a table of another possible way in which bits can be programmed into the storage locations to indicate quantifiable test results.

FIG. 6 illustrates a benefit obtained by programming the result data and/or limit data at respective storage locations across the integrated circuit. Primarily, failure analysis can be performed as to possible reasons why the integrated circuit fails its current test operation. Thus, if the integrated circuit does not pass 160 its current test 162, then a comparison may be needed between the previous result data and/or the previous limit data 164. That comparison can be made between test result data/limits of two test, wherein one test is either immediately subsequent to a previous test or is several test subsequent to the other test. The comparison may yield a possible skew between the immediately previous (or much earlier) test result data and the current test result data 166. Alternatively, there may be a difference between the current test limit data and the previous test limit data. For example, the previous test limit data may have been too loose relative to the current test limits. This would have allowed the integrated circuit to pass the previous test operation but would naturally fail the current test operation. More importantly, each test parameter has associated with it test result data. Likewise, each test parameter has an associated test limit. Comparisons of test results can be performed on a parameter-by-parameter basis. This can allow the operator to examine skews in, e.g., $V_{OL}$ separate from $V_{OH}$, or skews in propagation speed separate from skews in power supply current drain. Accordingly, it is appreciated that for each test operation, data may result from certain, selected test parameters the same as or different from test parameters monitored at other test operations.

If a skew has occurred, as shown in FIG. 6, then the current test operation failure may be deemed a latent failure 168. However, if monitoring the various test result bits and/or test limit bits of the current and previous test operations does not indicate a skew or improper limits, then it can be determined that a bad integrated circuit was inadvertently forwarded from the previous test operation as a good integrated circuit. Operation 166 can therefore determine possible bin mixing 170.

It is noted that data for a specific test parameter of a specific test operation is stored in a location separate from data of another test parameter either within that test operation or within another test operation. The test result as well as the test limit by which the result is compared must be converted from an analog value to a digital value. This entails quantifying the analog value as a discrete digital value. Conversion of analog information and digital information is generally well known and can be accomplished using multiple encoding schemes.

FIG. 7 illustrates an encoding scheme according to one embodiment. In particular, data quantities are attributed to a unique set of bits based on where those quantities fall within a particular quantity level. As shown in FIG. 7, a data quantity X can be attributed to an encoded series of bits 00000, for example. As the data quantity increases, then a corresponding bit will be programmed depending on where that quantity falls within multiple Y values. Accordingly, Y represents the resolution by which the programmable bits can be determined. The encoding scheme is chosen such that the least significant bit is programmed, followed by the next least significant bit as the data quantity progresses to the next Y resolution value.

FIG. 8 illustrates another encoding scheme in which the programmable bit progresses from a binary 0 value to a binary 1 value (i.e., 0000 to 0001) as the data quantity progresses to a Y value above an X value. When the data quantity goes to a 2Y value, then the programmable bits progresses to a binary 2 value (i.e., 0010 value). Of course, there can be numerous other encoding schemes used to represent a quantifiable analog test result or test limit. The example shown in FIGS. 7 and 8 are merely examples of two such encoding schemes.

It will be appreciated to those skilled in the art having the benefit of this disclosure that this invention is believed applicable to any integrated circuit which can embody non-volatile programmable storage locations. The storage locations can be programmed either electrically or mechanically and the mechanisms for programming the storage locations keeps track of bits programmed therein. In this manner, the mechanism can read the programmed bits and contribute a known status to those bits, either as test outcome bits, test result bits, or test limit bits for various test operations within a sequence of test operations applied to the integrated circuit. It is understood that the form of the invention shown is taken as exemplary, presently preferred embodiments. Regardless of how the integrated circuit is processed or assembled, the present invention is suited for identifying test results of select functional and parametric tests at one or more test operations, whereby the test operation outcomes, results and limits can be programmed before and after a die is packaged and possibly before and after the packaged die is shipped to a customer. Accordingly, the specification and drawings are to be regarded in an illustrative rather than a restrictive sense as to possibly numerous variations which fall within the spirit and scope of the present invention.

What is claimed is:

1. An integrated circuit, comprising a non-volatile storage device formed in a first address location reserved for receiving information as to a first test result magnitude obtained by performing a first electrical test upon the integrated circuit.

2. The integrated circuit as recited in claim 1, wherein said first address location is in an address space exclusive of a second address location configured to store bits used to operate the integrated circuit.

3. The integrated circuit as recited in claim 1, wherein said first electrical test occurs prior to enclosing the integrated circuit within a package, and wherein the programmed information is electrically readable after the integrated circuit is packaged.

4. The integrated circuit as recited in claim 1, wherein said first electrical test occurs after enclosing the integrated circuit within a package, and wherein the programmed information is electrically readable after the integrated circuit is packaged.

5. The integrated circuit as recited in claim 1, further comprising a second address location reserved for receiving information about a first test limit against which the first test result magnitude can be compared to indicate if the integrated circuit passes the first electrical test.

6. The integrated circuit as recited in claim 5, further comprising a mechanism adapted for connecting to the integrated circuit for (i) programming a first set of bits corresponding to the first test result, (ii) programming a second set of bits corresponding to the first test limit, and (iii) reading the first and second sets of bits to determine if the first test result exceeds in absolute magnitude the first test limit.

7. The integrated circuit as recited in claim 1, further comprising a third address location reserved for receiving information as to a second test result magnitude obtained by performing a second electrical test upon the integrated circuit subsequent to the first electrical test.

8. The integrated circuit as recited in claim 7, further comprising a mechanism adapted for connecting to the integrated circuit for (i) programming a first set of bits corresponding to the first test result, (ii) programming a second set of bits corresponding to the second test result, and (ii) reading the first and second sets of bits to determine a change in magnitude between the first test result and the second test result.

9. An apparatus for programming an integrated circuit, comprising:
 a programming mechanism adapted to address a first storage location within the integrated circuit reserved for receiving a first set of bits corresponding to a quantifiable test result obtained by performing a first electrical test upon the integrated circuit; and
 a read mechanism adapted to read the first set of bits.

10. The apparatus as recited in claim 9, wherein said programming mechanism is adapted to program a second set of bits corresponding to a quantifiable test result obtained by performing a second electrical test subsequent to the first electrical test.

11. The apparatus as recited in claim 10, wherein parameters and stimuli used in the second electrical test are equal to parameters and stimuli used in the first electrical test.

12. The apparatus as recited in claim 11, wherein said read mechanism is further adapted to compare the first and second sets of bits to determine a skew in results obtained during the first and second electrical tests.

13. The apparatus as recited in claim 9, wherein said programming mechanism is adapted to program a change in the first set of bits corresponding to a change in magnitude of the quantifiable test results.

14. The apparatus as recited in claim 9, wherein the first storage location is a non-volatile storage location.

15. The apparatus as recited in claim 9, wherein the first storage location is rendered a non-volatile storage location.

16. The apparatus as recited in claim 9, wherein the first set of bits are permanently stored within the first storage location.

17. A method for testing an integrated circuit, comprising:
programming a first set of bits substantially permanently into the integrated circuit identifying the magnitude of a test result arising from a first testing operation; and
programming a second set of bits substantially permanently into the integrated circuit identifying a pre-defined limit against which the test result can be compared to indicate if the integrated circuit passes the first testing operation.

18. The method as recited in claim 17, further comprising:
programming a third set of bits substantially permanently into the integrated circuit identifying the magnitude of a test result arising from a second testing operation subsequent to the first testing operation; and
programming a fourth set of bits substantially permanently into the integrated circuit identifying a pre-defined limit against which the test result of the second testing operation can be compared to indicate if the integrated circuit passes the second testing operation.

19. The method as recited in claim 18, wherein the second testing operation occurs subsequent to the first testing operation.

20. The method as recited in claim 18, further comprising reading the first and third set of bits to determine a skew in the magnitude of the corresponding test results.

21. The method as recited in claim 18, further comprising reading the second and fourth set of bits to determine a skew in the pre-defined limits against which the test results can be compared.

* * * * *